(12) United States Patent
Hayashi (10) Patent No.: US 10,755,849 B2
(45) Date of Patent: *Aug. 25, 2020

(54) COIL COMPONENT AND ELECTRONIC DEVICE

(71) Applicant: TAIYO YUDEN CO., LTD., Chuo-ku, Tokyo (JP)

(72) Inventor: Chiharu Hayashi, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/183,511

(22) Filed: Nov. 7, 2018

(65) Prior Publication Data

US 2019/0074130 A1    Mar. 7, 2019

Related U.S. Application Data

(63) Continuation of application No. 15/960,391, filed on Apr. 23, 2018, now Pat. No. 10,153,083.

(30) Foreign Application Priority Data

Apr. 27, 2017  (JP) ................. 2017-088776

(51) Int. Cl.
   *H05K 1/11*       (2006.01)
   *H01F 27/29*      (2006.01)
   (Continued)

(52) U.S. Cl.
   CPC .......... *H01F 27/29* (2013.01); *H01F 17/043* (2013.01); *H01F 27/24* (2013.01); *H01F 27/263* (2013.01);
   (Continued)

(58) Field of Classification Search
   CPC ........ H01F 17/043; H01F 27/29; H01F 27/24; H01F 27/263; H05K 1/111; H05K 1/181
   (Continued)

(56) References Cited

U.S. PATENT DOCUMENTS

6,191,933 B1    2/2001  Ishigaki et al.
6,326,875 B1   12/2001  Tuovinen
(Continued)

FOREIGN PATENT DOCUMENTS

JP        2004221474        8/2004

OTHER PUBLICATIONS

Notice of Allowance issued by U.S. Patent and Trademark Office, dated Aug. 10, 2018, for U.S. Appl. No. 15/960,391.

*Primary Examiner* — Tremesha S Willis
(74) *Attorney, Agent, or Firm* — Law Office of Katsuhiro Arai (57) ABSTRACT

In an exemplary embodiment, a coil component includes: a core 10 having a pillar part 24, and a hollow space 22 around the pillar part 24; a coil conductor 40 having a spiral part 42 placed around the pillar part 24, and a lead part 48a or 48b led out from the spiral part 42 toward the bottom face 28 of the core 10, which lead part includes an end part 46a or 46b extending in parallel with the bottom face 28 and serves as an external terminal 49a or 49b; and an insulated terminal 60 electrically insulated from the coil conductor 40, which is provided on at least the bottom face 28; wherein the total base area of the bottom part 72 of the dummy terminal 60, on the bottom face 28, is greater than the total base area of the external terminals 49a, 49b.

14 Claims, 11 Drawing Sheets

(51) Int. Cl.
  *H01F 27/28* (2006.01)
  *H05K 1/18* (2006.01)
  *H01F 27/24* (2006.01)
  *H05K 1/02* (2006.01)
  *H01F 27/26* (2006.01)
  *H01F 17/04* (2006.01)
  *H01F 27/22* (2006.01)

(52) U.S. Cl.
  CPC ..... *H01F 27/2823* (2013.01); *H01F 27/2828* (2013.01); *H01F 27/292* (2013.01); *H05K 1/0218* (2013.01); *H05K 1/111* (2013.01); *H05K 1/181* (2013.01); *H01F 27/22* (2013.01); *H01F 2017/046* (2013.01); *H05K 2201/1003* (2013.01)

(58) Field of Classification Search
  USPC .......................................................... 174/260
  See application file for complete search history.

(56) References Cited

U.S. PATENT DOCUMENTS

| | | | |
|---|---|---|---|
| 6,747,538 | B2 | 6/2004 | Kuwata et al. |
| 6,940,708 | B2 | 9/2005 | Yoshii et al. |
| 7,129,810 | B1 | 10/2006 | Kimura |
| 9,978,506 | B2 | 5/2018 | Ohtsubo et al. |
| 10,249,429 | B2 | 4/2019 | Arimitsu et al. |
| 2002/0067237 | A1* | 6/2002 | Nakata ............ H01F 27/29 336/212 |
| 2007/0057758 | A1 | 3/2007 | Sano |
| 2009/0267718 | A1 | 10/2009 | Nagano et al. |
| 2011/0102121 | A1 | 5/2011 | Otsuka et al. |
| 2011/0260821 | A1 | 10/2011 | Yamada et al. |
| 2016/0163442 | A1 | 6/2016 | Yoon et al. |
| 2016/0351314 | A1 | 12/2016 | Jeong et al. |
| 2016/0365191 | A1 | 12/2016 | Horie et al. |
| 2017/0032888 | A1 | 2/2017 | Park et al. |

* cited by examiner

COIL COMPONENT AND ELECTRONIC DEVICE

CROSS-REFERENCE TO RELATED APPLICATIONS

This application is a continuation of U.S. patent application Ser. No. 15/960,391, filed Apr. 23, 2018, which claims priority to Japanese Patent Application No. 2017-088776, filed Apr. 27, 2017, each disclosure of which is incorporated herein by reference in its entirety. The applicant herein explicitly rescinds and retracts any prior disclaimers or disavowals made in any parent, child or related prosecution history with regard to any subject matter supported by the present application.

BACKGROUND

Field of the Invention

The present invention relates to a coil component and an electronic device.

Description of the Related Art

As applications of coil components widen, there is a demand for coil components offering high durability against vibration and impact. For example, it is known that a coil component would offer improved mounting strength when mounted on a circuit board if, on its core in which a coil conductor is housed, a dummy terminal is installed (refer to Patent Literature 1, for example).

BACKGROUND ART LITERATURES

[Patent Literature 1] Japanese Patent Laid-open No. 2004-221474

SUMMARY

However, the coil component described in Patent Literature 1 may suffer a deformed or displaced coil conductor, or the coil conductor may have a broken wire in some cases, when large vibration or impact is applied to the coil component.

The present invention was created in light of the aforementioned problems, and its object is to improve durability against vibration and impact.

Any discussion of problems and solutions involved in the related art has been included in this disclosure solely for the purposes of providing a context for the present invention, and should not be taken as an admission that any or all of the discussion were known at the time the invention was made.

The present invention is a coil component, comprising: a core having a pillar part, and a hollow space around the pillar part, inside (the core forms an outer part and inside is the pillar and the hollow space around that); a coil conductor having a spiral part placed in the hollow space around the pillar part (a space remaining in the hollow space after placing therein the coil conductor may also be referred to as "a hollow space" depending on the context), and a lead part which is led out from the spiral part toward the principal outer surface constituting the bottom face of the core, and which includes an end part that extends in parallel with the bottom face of the core and serves as an external terminal; and a terminal electrically insulated from the coil conductor (hereinafter referred to as "dummy terminal" or "insulated terminal"), which is installed on the core in a manner covering at least the bottom face of the core; wherein the total base area of the bottom part of the dummy terminal on the bottom face of the core is greater than the total base area of the external terminal.

The aforementioned constitution may be such that, of the lead part of the coil conductor, the connection part that connects the spiral part with the end part is bonded to at least the core with an adhesive.

The aforementioned constitution may be such that the external terminal of the coil conductor is bonded to the bottom face of the core with an adhesive.

The aforementioned constitution may be such that there are multiple dummy terminals, and the external terminal of the coil conductor is placed on the first side of the bottom face of the core, while the bottom parts of the multiple dummy terminals are placed on the opposing second side and third side of the bottom face of the core.

The aforementioned constitution may be such that the dummy terminal is shaped to have: the bottom part positioned on the bottom face of the core; a top part positioned on the top face opposite the bottom face, of the core; and a side part coupling the bottom part and the top part.

The aforementioned constitution may be such that the dummy terminal has an opening that extends from the top part to the side part, and an adhesive is filled in the opening.

The aforementioned constitution may be such that the dummy terminal is shaped as a box that has: the bottom part positioned on the bottom face of the core; a top part positioned on the top face opposite the bottom face, of the core; three side parts coupling the bottom part and the top part; and an opening in which the core is stored.

The aforementioned constitution may be such that the dummy terminal is shaped so that its top part is larger than its bottom part in area.

The aforementioned constitution may be such that the top part of the dummy terminal covers all of the top face of the core.

The aforementioned constitution may be such that the dummy terminal is shaped to have: the bottom part positioned on the bottom face of the core; and a side part coupled to the bottom part and positioned on a side face that intersects the bottom face, of the core.

The present invention is an electronic device equipped with a coil component according to any of the foregoing, and a circuit board on which the coil component is mounted.

The aforementioned constitution may be such that the coil conductor has two of the lead parts, and one of the two lead parts is led out from the spiral part on the top face side of the core, while the other lead part is led out from the spiral part on the bottom face side of the core, where a higher voltage is applied to a first pad on the circuit board to which the external terminal of the one lead part is connected, than that to a second pad on the circuit board to which the external terminal of the other lead part is connected.

According to the present invention, durability against vibration and impact can be improved.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 1A is a perspective view, FIG. 1B is a plan view from the bottom face side.

FIGS. 2A and 2B are perspective views of the top core, while

FIG. 7A is a perspective view, FIG. 7B is a perspective cross-sectional view along A-A in FIG. 7A.

FIG. 8A is a perspective view.

FIG. 9A is a perspective view.

FIG. 10A is a perspective view, FIG. 10B is a plan view from the bottom face side.

FIG. 11A is a perspective cross-sectional view.

FIG. 12A is a plan view, FIG. 12B is a cross-sectional view along A-A in FIG. 12A.

DESCRIPTION OF THE SYMBOLS

10 Core
12 Top core
14 Bottom core
16 Top part
17 Lid part
18 Bottom part
19 Base part
20, 20a, 20b Side part
22, 22a, 22b Hollow space
24, 24a, 24b Pillar part
26 Top face
28 Bottom face
30 Side face
32 to 38 Side
40 Coil conductor
42 Spiral part
44a, 44b Connection part
46a, 46b End part
48a, 48b Lead part
49a, 49b External terminal
60 to 66 Dummy terminal
70 Top part
72 to 72b Bottom part
74 Side part
76 Opening
80 Solder
82 to 86 Adhesive
90 Circuit board
92a to 92c Pad
100 to 800 Coil component
900 Electronic device

DETAILED DESCRIPTION OF EMBODIMENTS

Examples of the present invention are explained below by referring to the drawings.

Example 1

Figure 1A:
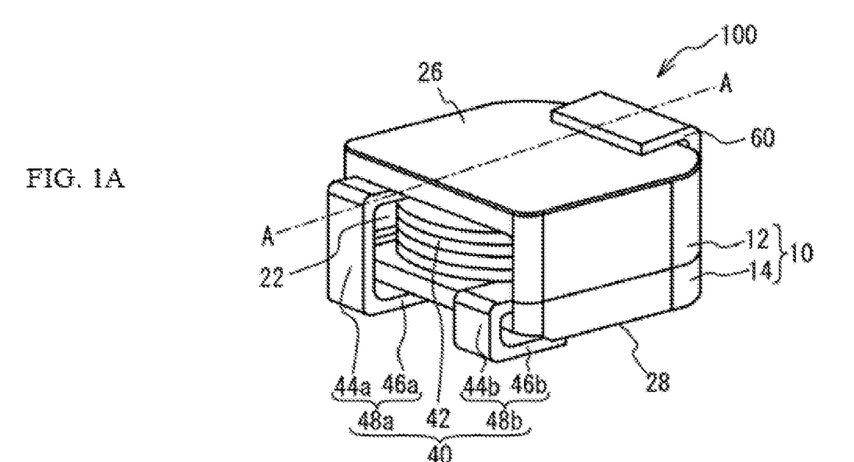
Figure 1B:
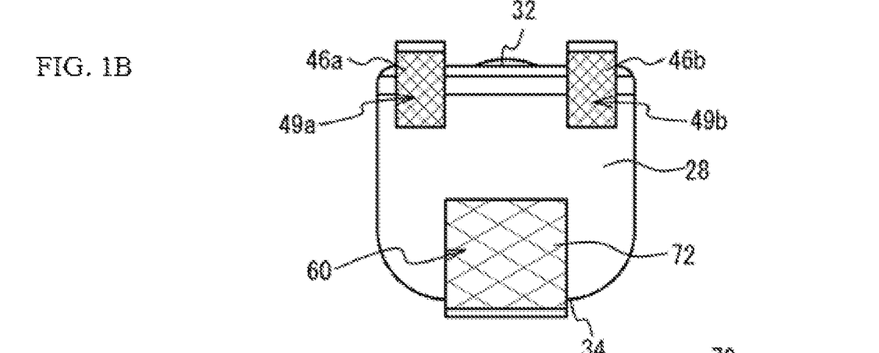
Figure 1C:
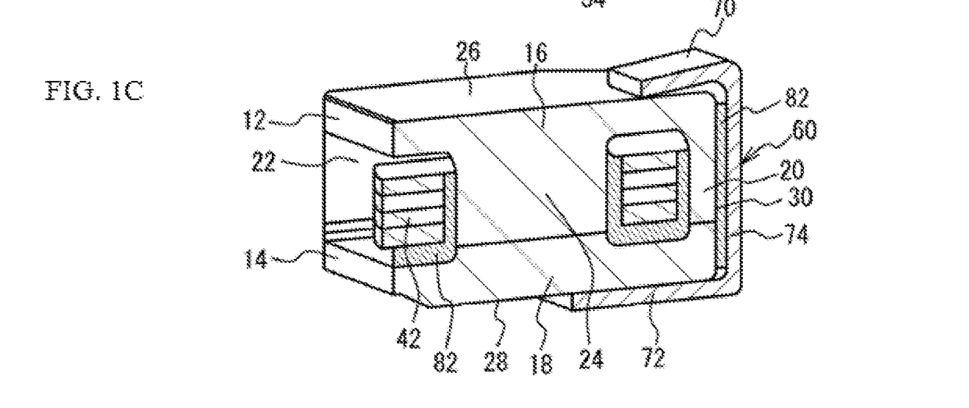
FIG. 1C is a perspective cross-sectional view along A-A in FIG. 1A, of the coil component pertaining to Example 1.

FIG. 1A is a perspective view, FIG. 1B is a plan view from the bottom face side, and FIG. 1C is a perspective cross-sectional view along A-A in FIG. 1A, of the coil component 100 pertaining to Example 1. It should be noted that, in the following explanations, the vertical direction is specified on the assumption that, when the coil component 100 is mounted on a circuit board, the circuit board is positioned vertically below the coil component 100. Also, while a solder is applied to the end parts 46a, 46b of the coil conductor 40 and the bottom part 72 of the dummy terminal 60, the solder is not illustrated in the drawings, except for FIGS. 3C, 4, 12B and 12C. As shown in FIGS. 1A through 1C, the coil component 100 in Example 1 is an inductor element comprising a core 10, a coil conductor 40, and a dummy terminal 60.

The core 10 is formed by a top core 12 and a bottom core 14, which are joined with an adhesive made of a thermosetting resin, etc., for example. The core 10 has a top part 16, a bottom part 18, and a side part 20, as well as a hollow space 22 inside. The core 10 has a rectangular shape whose one side is approx. 13 mm to 17 mm long in plan view, and which has rounded corners and a height of 6 mm to 8.5 mm, for example. The core 10 is open on one side face side so that the hollow space 22 is exposed to the exterior. The core 10 has a pillar part 24 inside the hollow space 22. The pillar part 24 extends vertically between the top part 16 and the bottom part 18. It should be noted that a glass film of approx. 5 μm to 50 μm in thickness may be provided on the outer surface of the core 10. This improves the insulation property and anti-rust property.

Figure 2A:
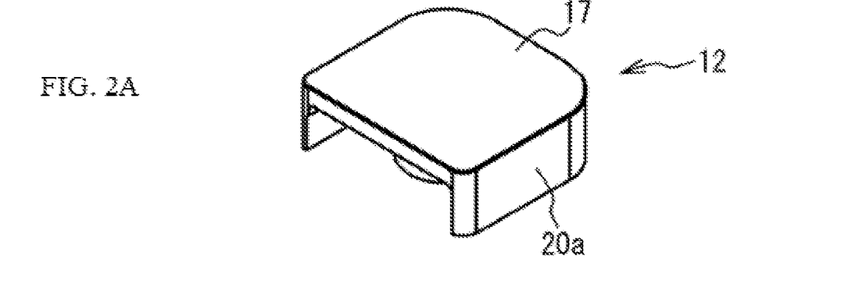
Figure 2B:
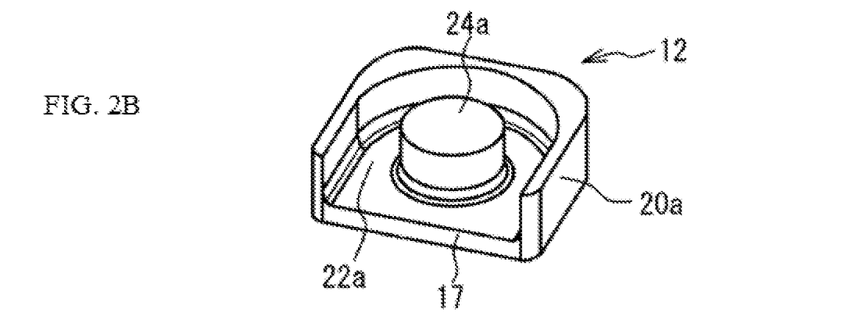
Figure 2C:
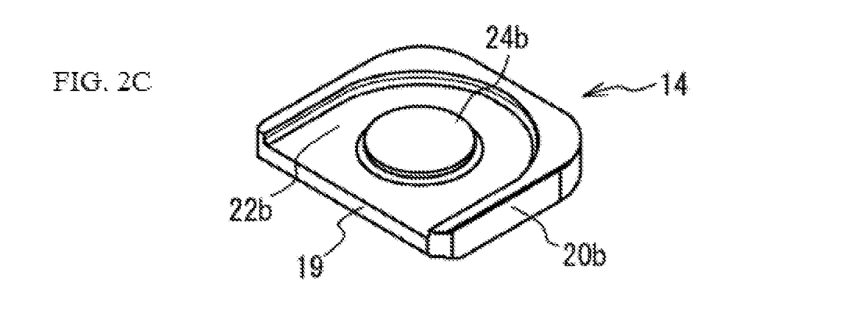
FIGS. 2C and 2D are perspective views of the bottom core.
Figure 2D:
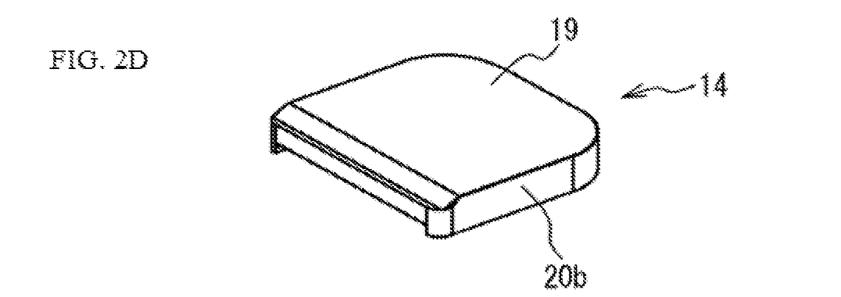

FIGS. 2A and 2B are perspective views of the top core 12, while FIGS. 2C and 2D are perspective views of the bottom core 14. FIGS. 2A and 2C are perspective views from above, while FIGS. 2B and 2D are perspective views from below. As shown in FIGS. 2A and 2B, the top core 12 has a lid 17 that constitutes the top part 16, and a side part 20a, and a hollow space 22a is formed inside. A cylindrically-shaped pillar part 24a is formed inside the hollow space 22a. The corners of the lid part 17 along the side part 20a and pillar part 24a are chamfered to rounded shapes. This improves durability against vibration and impact. The height of the side part 20a is roughly the same as that of the pillar part 24a, which is approx. 3 mm to 5 mm, for example. The diameter of the pillar part 24a is approx. 5 mm to 8 mm, for example. The top core 12 is formed by a magnetic material; or specifically, it is formed by a ferrite material or metal magnetic material, for example.

As shown in FIGS. 2C and 2D, the bottom core 14 has a base part 19 that constitutes the bottom part 18, and a side part 20b, and a hollow space 22b is formed inside. A cylindrically-shaped pillar part 24b is formed inside the hollow space 22b. The corners of the base part 19 along the side part 20b and pillar part 24b are chamfered to rounded shapes. The height of the side part 20b is roughly the same as that of the pillar part 24b, which is shorter than the height of the side part 20a and pillar part 24a of the top core 12, and is approx. 2 mm to 2.5 mm, for example. The diameter of the pillar part 24b, which is roughly the same as that of the pillar part 24a of the top core 12, is approx. 5 mm to 8 mm, for example. The bottom core 14 is formed by a magnetic material; or specifically, it is formed by a ferrite material or metal magnetic material identical to the material of the top core 12, for example.

As shown in FIGS. 1A through 1C and 2A through 2D, the side part 20a of the top core 12 is joined to the side part 20b of the bottom core 14 to form the side part 20 of the core 10, while the pillar part 24a of the top core 12 is joined to the pillar part 24b of the bottom core 14 to form the pillar part 24 of the core 10. It should be noted that the bottom core 14 may be formed only by the flat-shaped base part 19 on which the side part 20b and pillar part 24b are not formed, and the core 10 may be formed by joining the side part 20a and pillar part 24a of the top core 12 to the flat-shaped base part 19 of the bottom core 14.

Figure 3A:
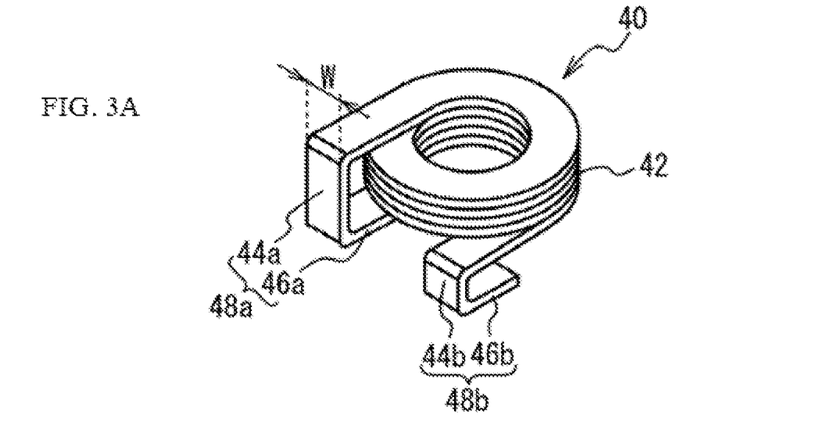
FIGS. 3A through 3C are perspective views of the coil conductor.
Figure 3B:
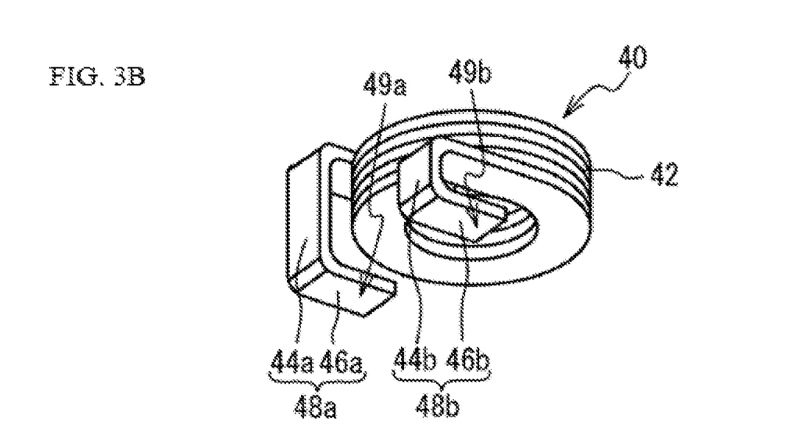
Figure 3C:
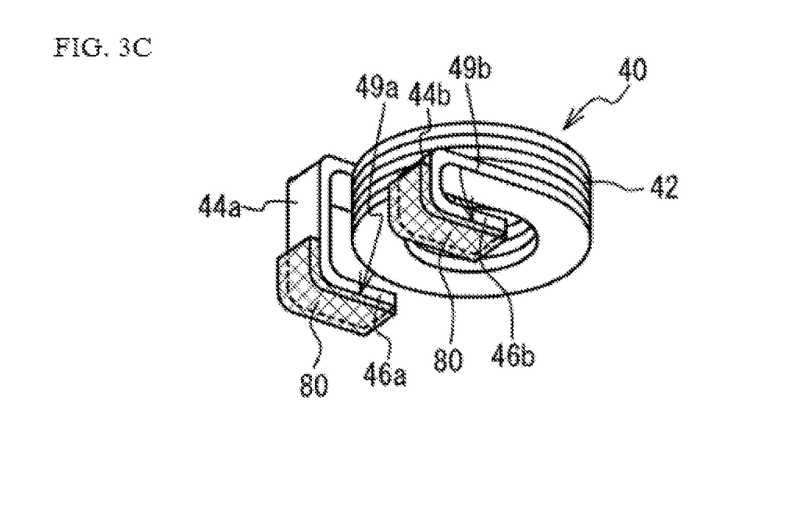

Next, the coil conductor 40 is explained using FIGS. 3A through 3C in addition to FIGS. 1A through 1C. FIGS. 3A through 3C are perspective views of the coil conductor 40. FIG. 3A is a perspective view from above, and FIG. 3B is a perspective view from below, of the coil conductor 40, while FIG. 3C is a perspective view showing a solder 80 provided to end parts 46a, 46b. The coil conductor 40 has a spiral part 42 which is placed around the pillar part 24 inside the hollow space 22 of the core 10, as well as lead parts 48a, 48b which are led out from the spiral part 42 toward the bottom face 28 of the core 10, and include a pair of end parts 46a, 46b extending in parallel with the bottom face 28 of the core 10. Also, the lead part 48a includes a connection part 44a that connects the spiral part 42 with the end part 46a, while the lead part 48b includes a connection part 44b that connects the spiral part 42 with the end part 46b. The lead part 48a is led out from the spiral part 42 on the top part 16 side of the core 10, while the lead part 48b is led out from the spiral part 42 on the bottom part 18 side of the core 10.

An adhesive 82 is provided between the spiral part 42 and the core 10, and the spiral part 42 and the core 10 are bonded together with the adhesive 82. The adhesive 82 is a thermosetting resin, for example. By using a thermosetting resin for the adhesive 82, the heat resistance and bonding strength can be improved. The width W of the coil conductor 40 is approx. 2.0 mm to 3.2 mm, for example. The coil conductor 40 is constituted by a conductive wire (such as copper (Cu) wire) covered with an insulating sheath (such as polyamide imide). The coil conductor 40 is a flat wire coil, for example, but it may also be a round wire coil. A solder 80 used for mounting the coil component 100 on a circuit board is provided to the base faces of the end parts 46a, 46b. The solder 80 has a composition of Sn-3Ag-0.75Cu, for example. As a result, the end parts 46a, 46b serve as external terminals 49a, 49b on which the solder 80 used for mounting the coil component 100 on a circuit board is provided. The solder 80 may be provided not only to the base faces of the end parts 46a, 46b, but also to parts of the connection parts 44a, 44b on their end part 46a, 46b sides. This way, the coil component 100 can be mounted on a circuit board more securely.

Figure 4:
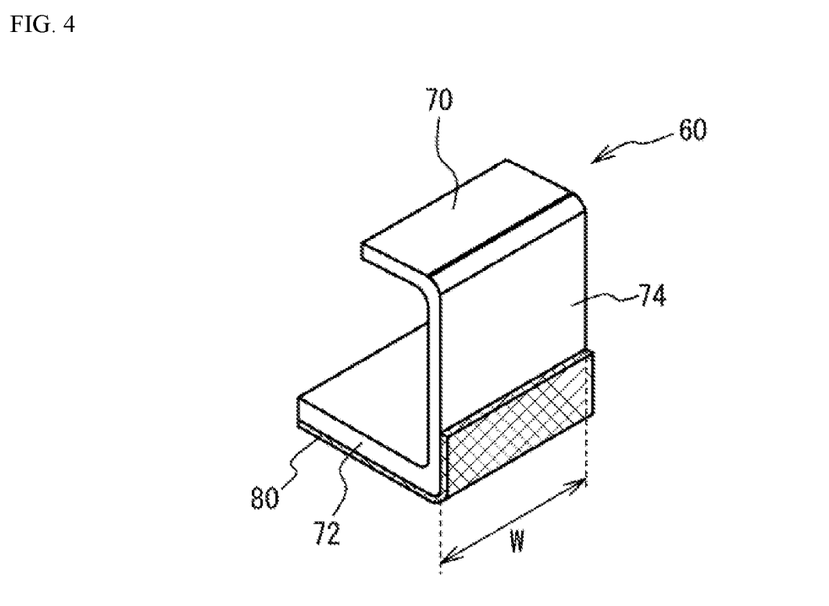
FIG. 4 is a perspective view of the dummy terminal.

Next, the dummy terminal 60 is explained using FIG. 4 in addition to FIGS. 1A through 1C. FIG. 4 is a perspective view of the dummy terminal 60. The dummy terminal 60 is electrically insulated from the coil conductor 40 and has virtually no contribution to the electrical characteristics of the coil component 100. The dummy terminal 60 extends from the top face 26, to the bottom face 28, via the side face 30, of the core 10, and is installed on the core 10. It should be noted that the bottom face 28 of the core 10 constitutes the principal outer surface of the core 10, while the top face 26 is the face opposite the bottom face 28 and the side face 30 is the face connecting to the top face 26 and the bottom face 28. As a result, the dummy terminal 60 has a shape (roughly U-shape) that has a top part 70 positioned on the top face 26, a bottom part 72 positioned on the bottom face 28, and a side part 74 coupling the top part 70 and the bottom part 72 and positioned on the side face 30, of the core 10.

The dummy terminal 60 is positioned on the side face 30 of the core 10 opposite the side on which the lead parts 48a, 48b of the coil conductor 40 are led out, and is installed on the core 10. An adhesive 82 is provided between the side part 74 of the dummy terminal 60 and the core 10, and the side part 74 and the core 10 are bonded together with the adhesive 82. It should be noted that the top part 70 and the core 10 may be bonded together with the adhesive 82. The dummy terminal 60 is formed by a copper (Cu) or copper (Cu) alloy plated with nickel (Ni) and tin (Sn), for example, but it may also be formed by other metal. The solder 80 used for mounting the coil component 100 on a circuit board is provided on the base face of the bottom part 72 of the dummy terminal 60. The solder 80 may be provided not only to the base face of the bottom part 72 of the dummy terminal 60, but also to parts of the side part 74 of the dummy terminal 60 on its bottom part 72 side. This way, the coil component 100 can be mounted on a circuit board more securely.

The width W of the dummy terminal 60 is approx. 5 mm to 9 mm, for example, and larger than the width W of the coil conductor 40. The base area S1 (cross-hatched portion in FIG. 1B) of the bottom part 72 of the dummy terminal 60 is larger than the total sum of the base areas (such as the base areas of the end parts 46a, 46b) S2a, S2b (cross-hatched portions in FIG. 1B) of the external terminals 49a, 49b (S1>S2a+S2b).

As described above, according to Example 1, the total base area S1 of the bottom part 72 of the dummy terminal 60 is larger than the total base area (S2a+S2b) of the external terminals 49a, 49b (S1>S2a+S2b). If the total base area S1 of the bottom part 72 of the dummy terminal 60 is small, the external terminals 49a, 49b may receive a considerable mechanical stress from the impact that generates when the coil component 100 is mounted on a circuit board, or vibration that generates after the mounting, and the coil conductor 40 may be damaged as a result. By increasing the total base area S1 of the bottom part 72 of the dummy terminal 60, however, more of the mechanical stress from vibration or impact is distributed over the dummy terminal 60, and the mechanical stress applied to the external terminals 49a, 49b can be reduced. Consequently, durability of the coil component 100 against vibration or impact applied to it, can be improved.

It should also be noted that, although the coil component 100 generates heat as it operates, the generated heat can effectively be dissipated or released through the bottom part of the dummy terminal 60, i.e., the property, of the coil component 100, of dissipating heat to the circuit board on which it is mounted, can be improved by increasing the total base area S1 of the bottom part 72 of the dummy terminal 60.

Also, according to Example 1, the external terminals 49a, 49b of the coil conductor 40 are placed on a side 32 side of the bottom face 28 of the core 10, while the bottom part 72 of the dummy terminal 60 is placed on a side 34 side opposite the side 32, of the bottom face 28 of the core 10, as shown in FIG. 1B. This way, the mechanical stress from vibration or impact can be distributed more effectively to the external terminals 49a, 49b and to the dummy terminal 60, so durability improves further.

From the viewpoint of reducing the mechanical stress applied to the external terminals 49a, 49b, the total base area of the bottom part 72 of the dummy terminal 60 is preferably 1.5 times or more, or more preferably twice or more, or most preferably three times or more, the total base area of the external terminals 49a, 49b.

As shown in FIG. 1C, the bottom part 72 of the dummy terminal 60 may not be bonded to the core 10 with an adhesive. Since the bottom face 28 of the core 10 is a mounting surface which is mounted on a circuit board, not bonding the bottom part 72 of the dummy terminal 60 to the core 10 with an adhesive prevents contamination of the base faces of the external terminals 49a, 49b of the coil conductor 40 due to the adhesive, and mounting failure can be prevented as a result.

Preferably the thickness of the solder 80 provided to the end parts 46a, 46b of the coil conductor 40 is greater than the thickness of the solder 80 provided to the bottom part 72 of the dummy terminal 60. This prevents the external terminals 49a, 49b of the coil conductor 40 from not being connected to the pads on the circuit board when the coil component 100 is mounted on a circuit board. To provide an example, preferably the thickness of the solder 80 provided to the end parts 46a, 46b of the coil conductor 40 is 3 μm to 30 μm. This is to ensure wettability of solder. Also, preferably the difference between the thickness of the solder 80 provided to the end parts 46a, 46b of the coil conductor 40, and the thickness of the solder 80 provided to the bottom part 72 of the dummy terminal 60, is 20 μm or less. This is to ensure balanced wettability of solder at the time of mounting.

Example 2

Figure 5:
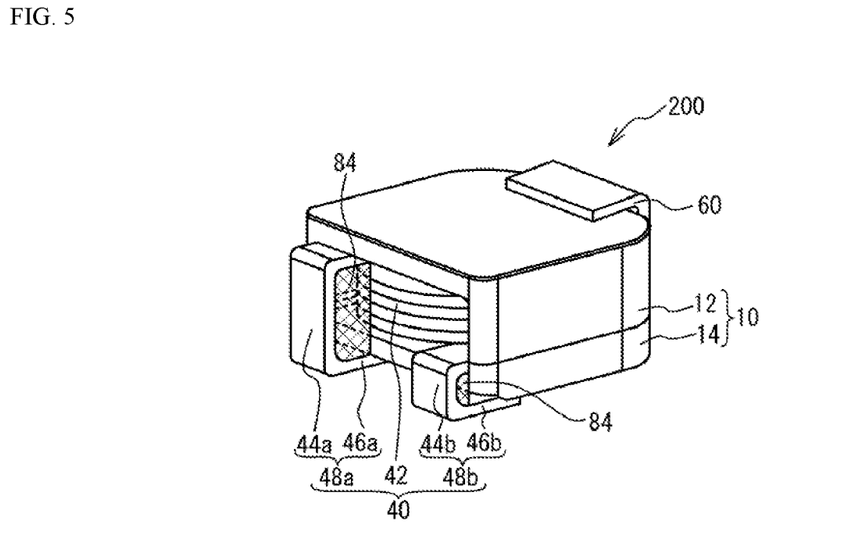
FIG. 5 is a perspective view of the coil component pertaining to Example 2.

FIG. 5 is a perspective view of a coil component 200 pertaining to Example 2. As shown in FIG. 5, the coil component 200 in Example 2 is such that, of the lead parts 48a, 48b of the coil conductor 40, the connection parts 44a, 44b are bonded at least to the core 10 with an adhesive 84. For example, the connection part 44a is bonded to the core 10 and the spiral part 42 with the adhesive 84, while the connection part 44b is bonded to the core 10 with the adhesive 84. For the adhesive 84, a thermosetting resin, photosetting resin, or any of various other adhesive materials may be used; however, the heat resistance and bonding strength can be improved by using a thermosetting resin. The remaining constitutions are the same as those in Example 1 and therefore not explained.

According to Example 2, the connection parts 44a, 44b of the coil conductor 40 are bonded at least to the core 10 with the adhesive 84. This prevents the connection parts 44a, 44b from deforming, even when a mechanical stress is applied externally to the connection parts 44a, 44b. As a result, durability against vibration or impact can be improved.

From the viewpoint of preventing the connection parts 44a, 44b from deforming, preferably the connection part 44a included in the lead part 48a that has been led out from the spiral part 42 on the top part 16 side of the core 10, is bonded to the core 10 and spiral part 42 with the adhesive 84.

Example 3

Figure 6:
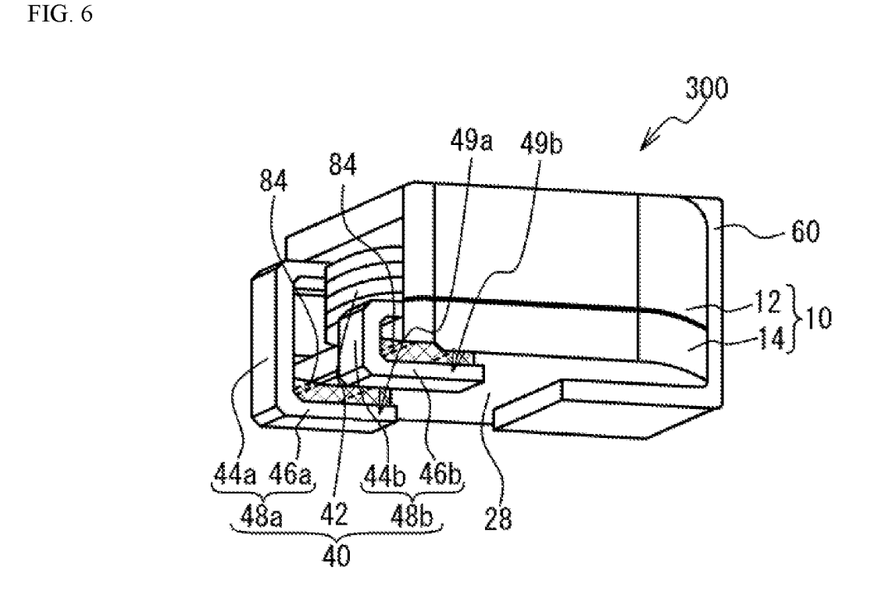
FIG. 6 is a perspective view of the coil component pertaining to Example 3.

FIG. 6 is a perspective view of a coil component 300 pertaining to Example 3. As shown in FIG. 6, the coil component 300 in Example 3 is such that the end parts 46a, 46b of the coil conductor 40 are bonded to the bottom face 28 of the core 10 with the adhesive 84. In other words, the external terminals 49a, 49b of the coil conductor 40 are bonded to the bottom face 28 of the core 10 with the adhesive 84. The remaining constitutions are the same as those in Example 1 and therefore not explained.

According to Example 3, the external terminals 49a, 49b of the coil conductor 40 are bonded to the bottom face 28 of the core 10 with the adhesive 84. This prevents the external terminals 49a, 49b from deforming, even when a mechanical stress is applied externally to the external terminals 49a, 49b. As a result, durability against vibration or impact can be improved. It should be noted that, to prevent a mounting failure from occurring due to the adhesive 84, preferably the adhesive 84 is kept from oozing out of the space between the external terminals 49a, 49b of the coil conductor 40 and the bottom face 28 of the core 10.

Example 4

Figure 7A:
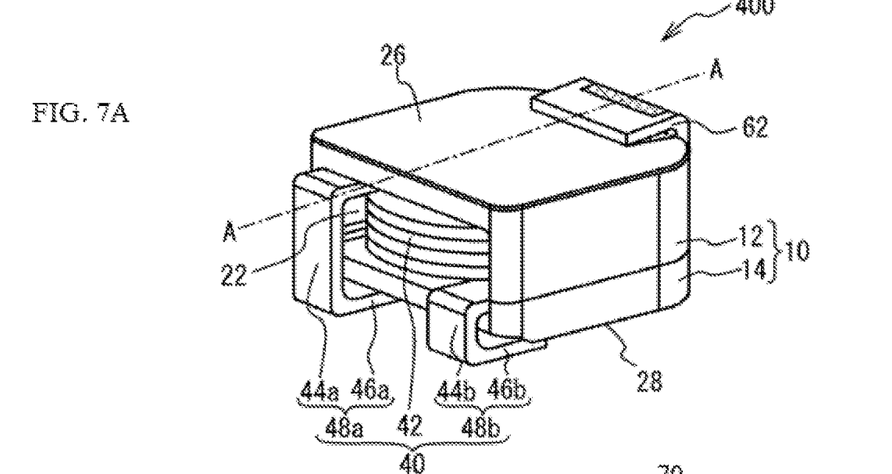
Figure 7B:
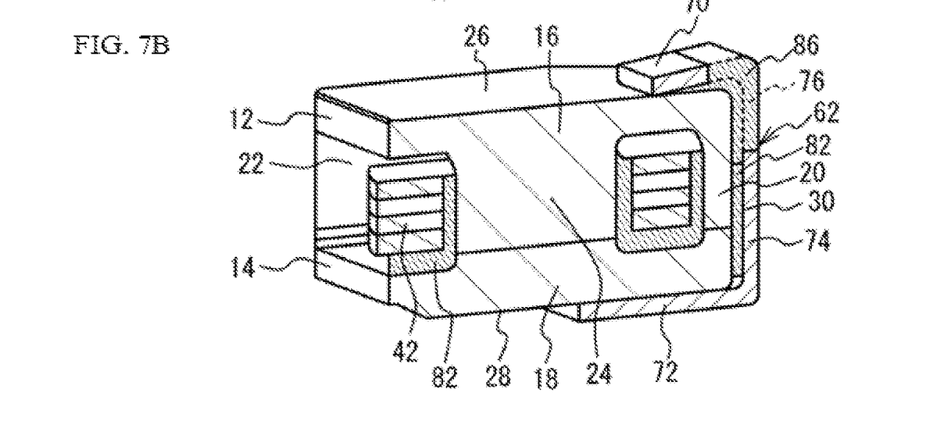
Figure 7C:
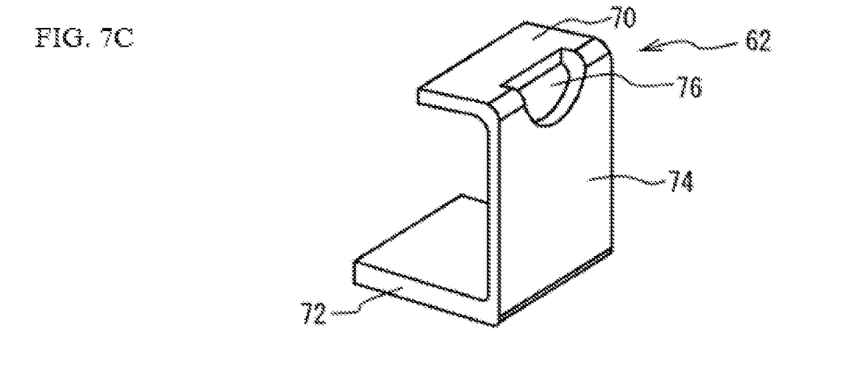
FIG. 7C is a perspective view of the dummy terminal, of the coil component pertaining to Example 4.

FIG. 7A is a perspective view, FIG. 7B is a perspective cross-sectional view along A-A in FIG. 7A, and FIG. 7C is a perspective view of a dummy terminal 62, of a coil component 400 pertaining to Example 4. As shown in FIGS. 7A through 7C, the coil component 400 in Example 4 is such that the dummy terminal 62 has an opening 76 that extends from the top part 70 to the side part 74. In other words, the opening 76 is formed over a position that includes the corners of the dummy terminal 62 between the top part 70 and the side part 74. The opening 76 is filled with an adhesive 86. Accordingly, the adhesive 86 not only bonds the dummy terminal 62 and the core 10, but it is also applied on the side face of the dummy terminal 62 at the opening 76. The adhesive 86 may be a thermosetting resin or photosetting resin, or any other adhesive material. The remaining constitutions are the same as those in Example 1 and therefore not explained.

According to Example 4, the dummy terminal 62 has the opening 76 that extends from the top part 70 to the side part 74. The opening 76 is filled with the adhesive 86. By thus filling the adhesive 86 in the opening 76 provided in the dummy terminal 62, the side face portion of the opening 76 contributes to bonding, and the bonding area between the dummy terminal 62 and the core 10 increases as a result. This allows for secure bonding of the dummy terminal 62 to the core 10. Secure bonding of the dummy terminal 62 to the core 10 helps achieve the effect of distributing the mechanical stress from vibration or impact to the external terminals 49a, 49b and to the dummy terminal 62. As a result, durability of the coil component 400 against vibration or impact applied to it, can be improved.

Additionally, filling the adhesive 86 in the opening 76 provided in the dummy terminal 62 makes it possible to confirm, from the exterior, that the dummy terminal 62 is bonded to the core 10 with the adhesive 86. This allows for easy inspection, based on appearance, of the dummy terminal 62 for non-attachment of adhesive and other defects.

Also, according to Example 4, the opening 76 extends from the top part 70, to the side part 74, of the dummy terminal 62. This mitigates the stress that generates in the dummy terminal 62 when the dummy terminal 62 is fitted onto the core 10. It also improves the ease of bending the top part 70 of the dummy terminal 62 with respect to its side part 74.

Example 5

Figure 8A:
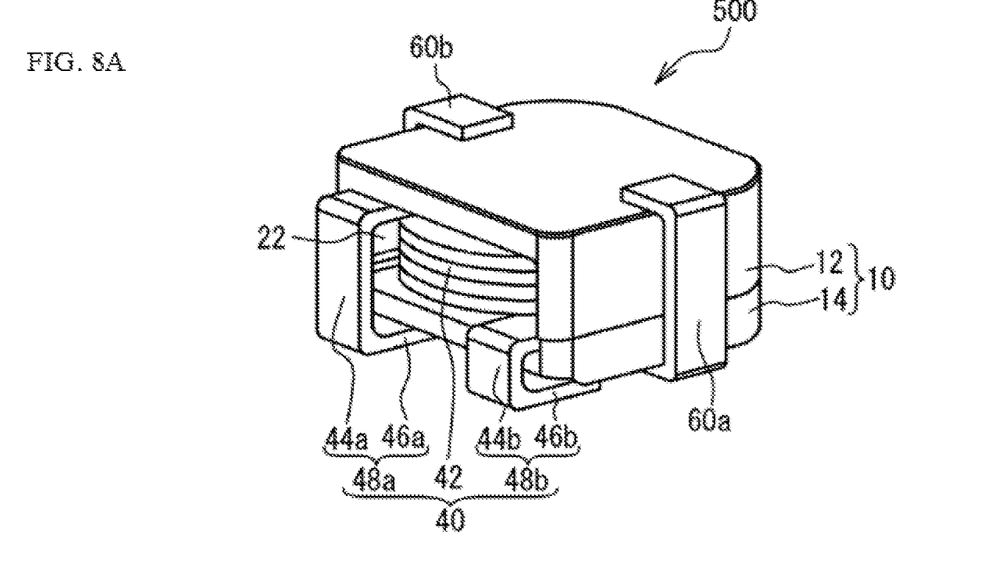
Figure 8B:
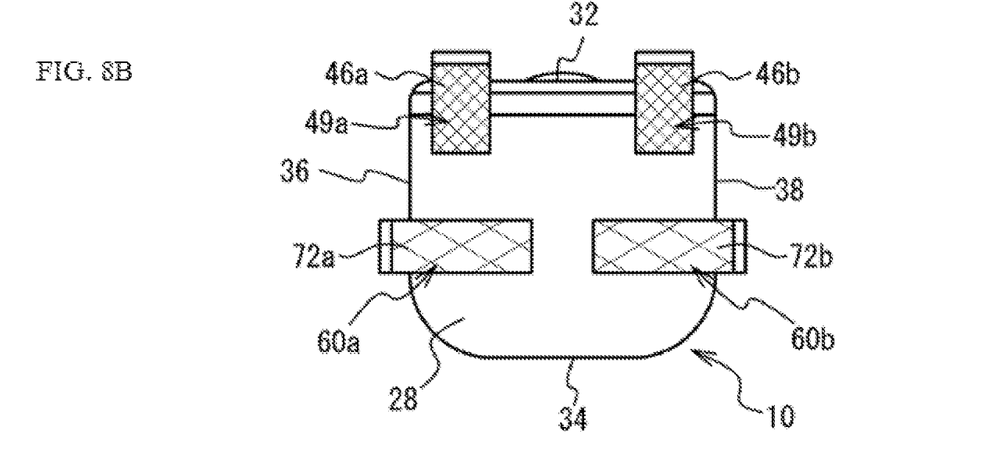
FIG. 8B is a plan view from the bottom face side, of the coil component pertaining to Example 5.

FIG. 8A is a perspective view, and FIG. 8B is a plan view from the bottom face side, of a coil component 500 pertaining to Example 5. As shown in FIGS. 8 A and 8B, the coil component 500 in Example 5 is such that multiple dummy terminals 60a, 60b are installed on the core 10. The dummy terminals 60a, 60b are provided, in a manner opposing each other, on the side faces of the core 10, which intersect the side face of the core 10 on which the lead parts 48a, 48b of the coil conductor 40 have been led out. This means that the external terminals 49a, 49b of the coil conductor 40 are placed on the side defined by the side 32 side of the bottom face 28 of the core 10, while the bottom parts 72a, 72b of the dummy terminals 60a, 60b are placed on the side defined by the side 36, 38 of the bottom face 28 of the core 10, respectively, which intersect the side 32 and are opposed to each other. The total sum (S1a+S1b) of the base areas S1a, S1b (cross-hatched portions) of the bottom parts 72a, 72b of the dummy terminals 60a, 60b is larger than the total sum of the base areas S2a, S2b (cross-hatched portions) of the external terminals 49a, 49b (S1a+S1b>S2a+S2b). The remaining constitutions are the same as those in Example 1 and therefore not explained.

According to Example 5, multiple dummy terminals 60a, 60b are provided. Even in this case, durability of the coil component 500 against vibration or impact applied to it can be improved, just like in Example 1, by making the total base area (S1a+S1b) of the bottom parts 72a, 72b of the multiple dummy terminals 60a, 60b larger than the total base area (S2a+S2b) of the external terminals 49a, 49b.

Also, according to Example 5, the external terminals 49a, 49b of the coil conductor 40 are placed on the side 32 side of the bottom face 28 of the core 10, while the bottom parts 72a, 72b of the multiple dummy terminals 60a, 60b are placed on the opposing sides 36, 38 of the bottom face 28 of the core 10, respectively. Because of this, the mechanical stress from vibration or impact applied to the coil component 500 can be effectively distributed to the external terminals 49a, 49b and to the dummy terminals 60a, 60b, and therefore durability improves further. It should be noted that, from the viewpoint of distributing mechanical stress, preferably the bottom parts 72a, 72b of the dummy terminals 60a, 60b are provided in symmetry with respect to the center line between the sides 36, 38.

Example 6

Figure 9A:
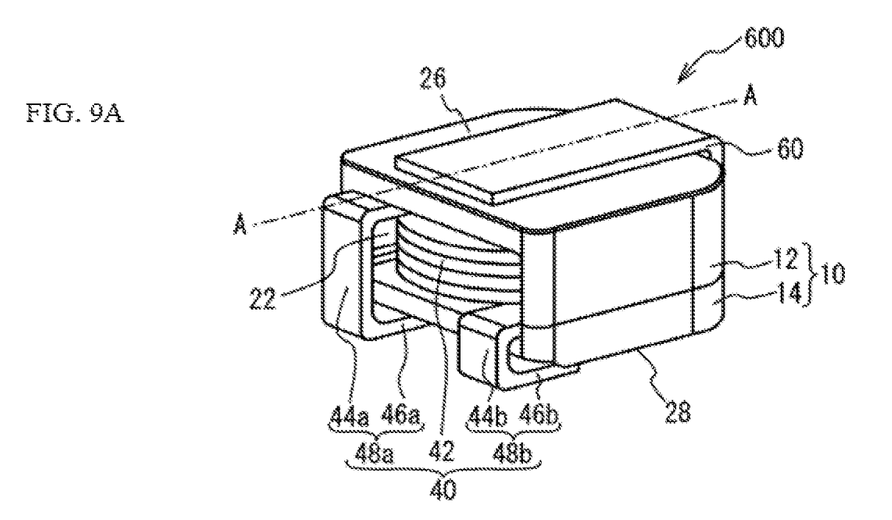
Figure 9B:
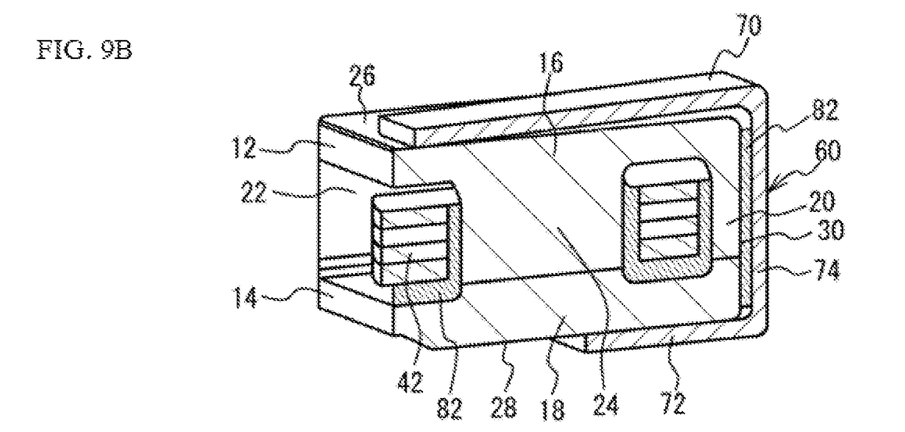
FIG. 9B is a perspective cross-sectional view along A-A in FIG. 9A, of the coil component pertaining to Example 6.

FIG. 9A is a perspective view, and FIG. 9B is a perspective cross-sectional view along A-A in FIG. 9A, of a coil component 600 pertaining to Example 6. As shown in FIGS. 9A and 9B, the coil component 600 in Example 6 is such that the top part 70 of the dummy terminal 60 has a larger shape compared to the bottom part 72. In other words, the area of the top part 70 of the dummy terminal 60 is larger than the area of the bottom part 72. The remaining constitutions are the same as those in Example 1 and therefore not explained.

In Example 1, the bottom part 72 of the dummy terminal 60 had a shape of a larger area compared to the top part 70; as in Example 6, however, the top part 70 of the dummy terminal 60 may have a shape having a larger area compared to the bottom part 72. When the top part 70 of the dummy terminal 60 has a larger area than the bottom part 72, the electric field generated by the coil conductor 40 can be effectively shielded by connecting the dummy terminal 60 to ground.

It should be noted that, from the viewpoint of shielding the electric field, preferably the top part 70 of the dummy terminal 60 covers at least one-half, or more preferably at least two-thirds, or most preferably all, of the top face 26 of the core 10.

Example 7

Figure 10A:
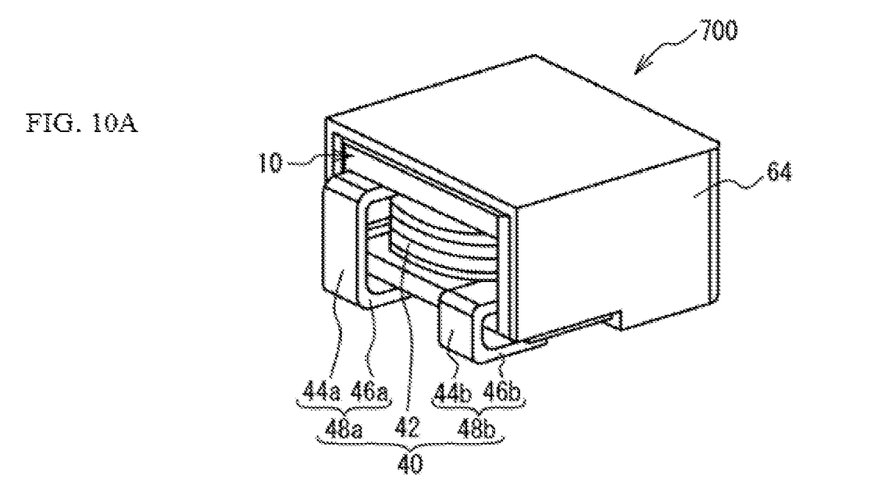
Figure 10B:
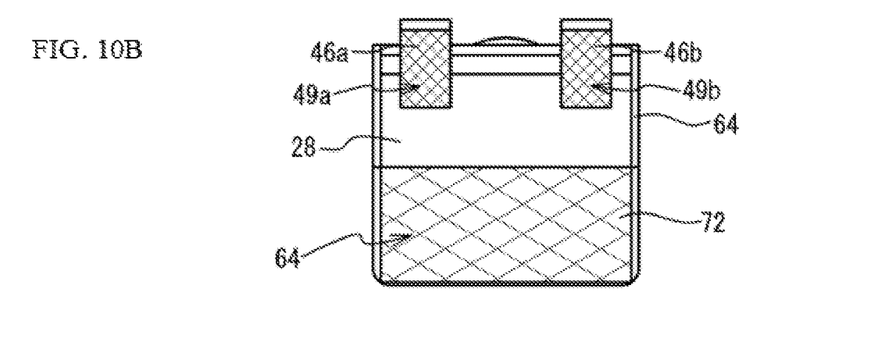
Figure 10C:
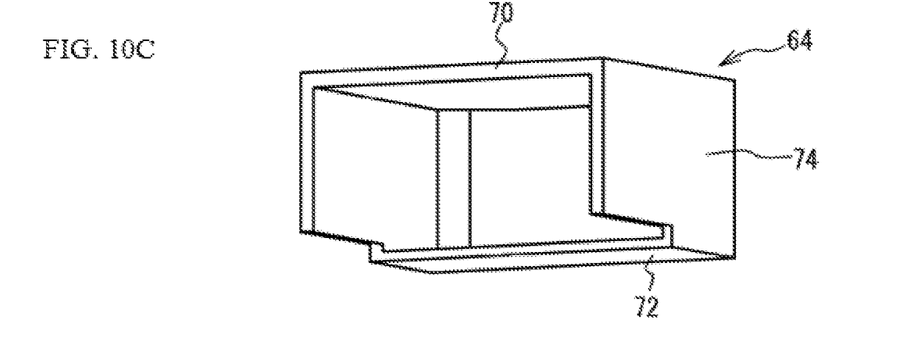
FIG. 10C is a perspective view of the dummy terminal, of the coil component pertaining to Example 7.

FIG. 10A is a perspective view, FIG. 10B is a plan view from the bottom face side, and FIG. 10C is a perspective view of a dummy terminal 64, of a coil component 700 pertaining to Example 7. As shown in FIGS. 10A through 10C, the coil component 700 in Example 7 is such that the dummy terminal 64 is shaped as a box that has a top part 70, a bottom part 72, and three side parts 74 that couple the top part 70 and the bottom part 72. The core 10 is stored inside the box-shaped dummy terminal 64. In other words, all of the top face 26 of the core 10 is covered by the top part 70 of the dummy terminal 64. Also, all of the side face 30 of the core 10 is covered by the side parts 74 of the dummy terminal 64. The remaining constitutions are the same as those in Example 1 and therefore not explained.

According to Example 7, the dummy terminal 64 is shaped as a box that has a top part 70 positioned on the top face 26, a bottom part 72 positioned on the bottom face 28, and three side parts 74 coupling the top part 70 and the bottom part 72 and positioned on the side face 30, of the core 10, as well as an opening in which the core 10 is stored. Because the core 10 is thus stored in the box-shaped dummy terminal 64, durability of the coil component 700 against vibration or impact applied to it can be improved further. Additionally, covering the top face 26 and side face 30 of the core 10 with the dummy terminal 64 allows the heat generated by the coil conductor 40 to dissipate better.

Also, according to Example 7, the top part 70 of the dummy terminal 64 covers all of the top face 26 of the core 10. As a result, the electric field generated by the coil conductor 40 can be shielded more effectively.

Example 8

Figure 11A:
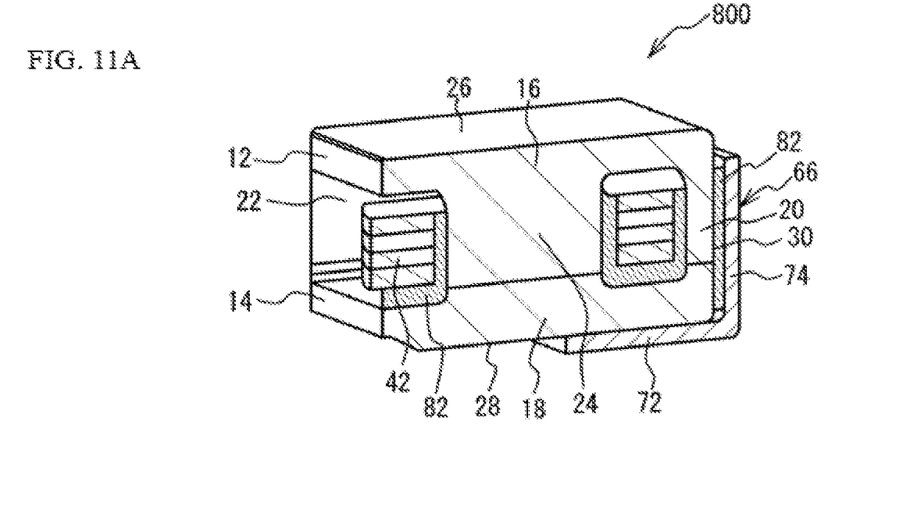
Figure 11B:
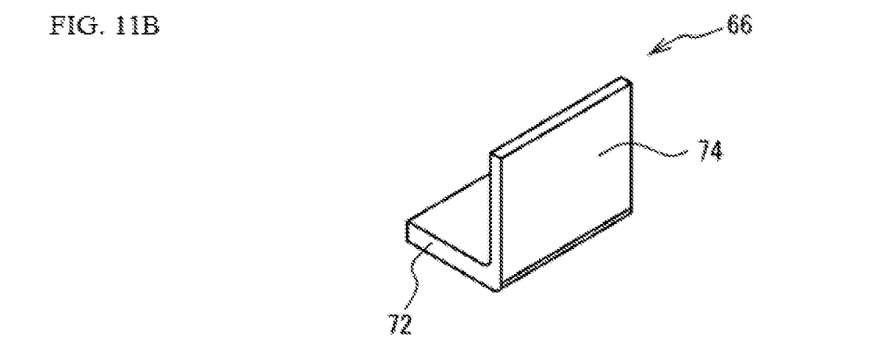
FIG. 11B is a perspective view of the dummy terminal, of the coil component pertaining to Example 8.

FIG. 11A is a perspective cross-sectional view, and FIG. 11B is a perspective view of a dummy terminal 66, of a coil component 800 pertaining to Example 8. As shown in FIGS. 11A and 11B, the coil component 800 in Example 8 has a shape (roughly L-shape) that has a bottom part 72 positioned on the bottom face 28, and a side part 74 coupled to the bottom part 72 and positioned on the side face 30, of the core 10. The remaining constitutions are the same as those in Example 1 and therefore not explained.

In Example 1, the dummy terminal 60 illustrated was shaped to have a top part 70, a bottom part 72, and a side part 74 coupled to the top part 70 and the bottom part 72, while in Example 7, the dummy terminal 64 illustrated as shaped as a box having a top part 70, a bottom part 72, and three side parts 74 coupled to the top part 70 and the bottom part 72.

However, the present invention is not limited to the foregoing and, as shown in Example 8, the dummy terminal 66 may be shaped to have a bottom part 72 and a side part 74 coupled to the bottom part 72.

Example 9

Figure 12A:
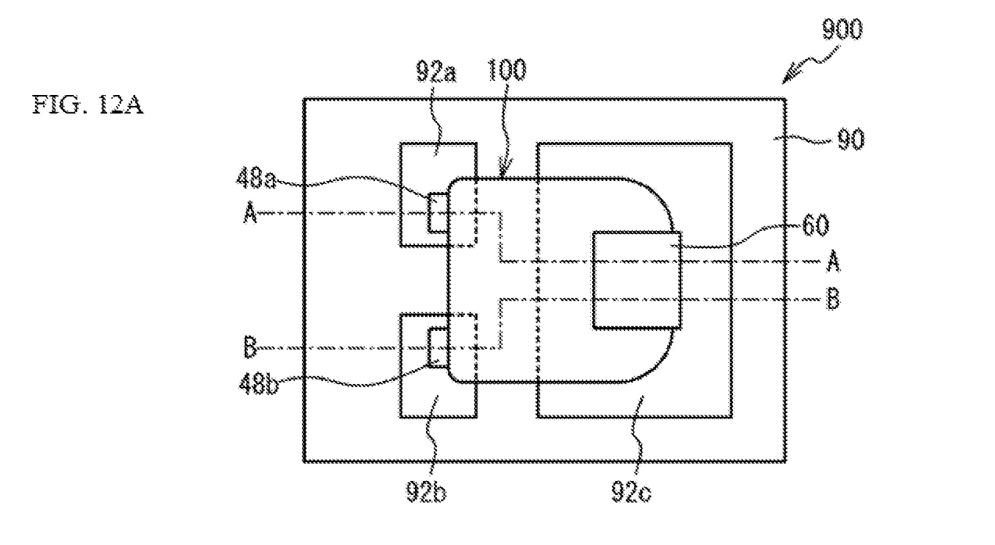
Figure 12B:
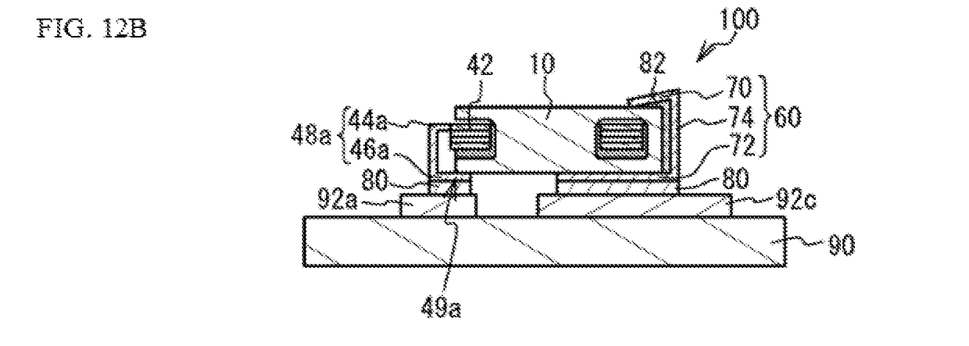
Figure 12C:
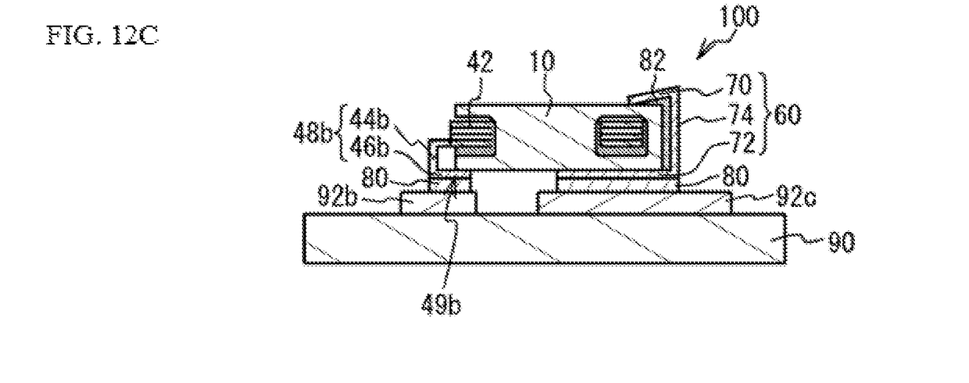
FIG. 12C is a cross-sectional view along B-B in FIG. 12A, of the electronic device pertaining to Example 9.

FIG. 12A is a plan view, FIG. 12B is a cross-sectional view along A-A in FIG. 12A, and FIG. 12C is a cross-sectional view along B-B in FIG. 12A, of an electronic device 900 pertaining to Example 9. As shown in FIGS. 12A through 12C, the electronic device 900 in Example 9 is a DC-DC converter, for example, equipped with the coil component 100 in Example 1 and a circuit board 90 on which the coil component 100 is mounted.

The external terminal 49*a* of the coil component 100 is connected to a signal pad 92*a* on the circuit board 90 via the solder 80, while the external terminal 49*b* is connected to a signal pad 92*b* on the circuit board 90 via the solder 80. The bottom part 72 of the dummy terminal 60 is connected to a ground pad 92*c* on the circuit board 90 via the solder 80. When the coil component 100 is mounted on the circuit board 90, the solder 80 provided to the end parts 46*a*, 46*b* melts before the solder 80 provided to the bottom part 72 of the dummy terminal 60 does. This is because almost all of the bottom part 72 of the dummy terminal 60 is contacting the core 10 which is a magnetic material, and therefore the temperature of the solder 80 provided to the end parts 46*a*, 46*b* rises faster. A higher voltage is applied to the pad 92*a* than to the pad 92*b*. For example, a voltage of 50 V is applied to the pad 92*a*, while a voltage of 5 V is applied to the pad 92*b*.

As described above, according to Example 9 a higher voltage is applied to the pad 92*a* to which the external terminal 49*a* of the lead part 48*a* that has been led out from the spiral part 42 on the top face 26 side of the core 10 is connected, than to the pad 92*b* to which the external terminal 49*b* of the lead part 48*b* that has been led out from the spiral part 42 on the bottom face 28 side of the core 10 is connected. The electric field strength generating on the lead part 48*a* side to which the pad 92*a* under a higher voltage is connected, is greater than the electric field strength generating on the lead part 48*b* side to which the pad 92*b* under a lower voltage is connected. For this reason, the fact that the lead part 48*a* is led out from the spiral part 42 on the top face 26 side of the core 10 means the location where greater electric field strength generates is positioned near the top part 70 of the dummy terminal 60, and this in turn allows for effective shielding of the electric field.

It should be noted that, while the electronic device 900 illustrated in Example 9 was equipped with the coil component 100 in Example 1, it may be equipped with the coil component in any of Examples 2 through 8.

The foregoing described examples of the present invention in detail; however, the present invention is not limited to these specific examples, and various modifications and changes can be added so long as they do not deviate from the key points of the present invention as described in "What Is Claimed Is."

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A coil component comprising:
   a core formed by a metal magnetic material;
   a coil conductor having:
      a spiral part placed inside the core; and
      lead parts, each of which is led out from the spiral part toward a principal outer surface constituting a bottom face of the core, and which includes an end part that extends in parallel with the bottom face of the core and serves as an external terminal; and
   at least one insulated terminal electrically insulated from the coil conductor, wherein the at least one insulated terminal is formed by metal and installed on the core in a manner being provided on at least the bottom face of the core;
   wherein a total base area of a bottom part of the at least one insulated terminal provided on the bottom face of the core, is greater than a total base area of the end parts of the external terminals.

2. The coil component according to claim 1, wherein, of the lead parts of the coil conductor, a connection part that connects the spiral part with the end part is bonded to at least the core with an adhesive.

3. The coil component according to claim 1, wherein the external terminal of the coil conductor is bonded to the bottom face of the core with an adhesive.

4. The coil component according to claim 1, wherein:
   the at least one insulated terminal is a plurality of insulated terminals electrically insulated from the coil conductor; and
   the external terminals of the coil conductor are placed on a first side of the bottom face of the core, and the bottom parts of the plurality of the insulated terminals are placed on a second side and a third side, opposed to each other, of the bottom face of the core.

5. The coil component according to claim 1, wherein the at least one insulated terminal is shaped to have: the bottom part positioned on the bottom face of the core; a top part positioned on a top face opposite the bottom face, of the core; and a side part coupling the bottom part and the top part.

6. The coil component according to claim 5, wherein the at least one insulated terminal has an opening that extends from the top part to the side part, and an adhesive is filled in the opening.

7. The coil component according to claim 1, wherein the at least one insulated terminal is shaped as a box that has: the bottom part positioned on the bottom face of the core; a top part positioned on a top face opposite the bottom face, of the core; three side parts coupling the bottom part and the top part; and an opening in which the core is stored.

8. The coil component according to claim 5, wherein the at least one insulated terminal is shaped so that the top part is larger than the bottom part in area.

9. The coil component according to claim 8, wherein the top part of the at least one insulated terminal covers all of the top face of the core.

10. The coil component according to claim 1, wherein the at least one insulated terminal is shaped to have: the bottom part positioned on the bottom face of the core; and a side part coupled to the bottom part and positioned on a side face that crosses with the bottom face, of the core.

11. The coil component according to claim 1, wherein the core has a pillar part and a hollow space around the pillar part, and the spiral part is placed in the hollow space around the pillar part.

12. The coil component according to claim 1, wherein the core is formed by an upper part and a lower part which are discrete parts and joined together.

13. An electronic device equipped with a coil component according to claim 1, and a circuit board on which the coil component is mounted.

14. The electronic device according to claim 13, wherein:
the lead parts of the coil conductor are constituted by two lead parts; and
of the two lead parts, one lead part is led out from the spiral part on a top face side of the core, and another lead part is led out from the spiral part on a bottom face side of the core,
wherein the circuit board has a first pad on the circuit board to which the external terminal of the one lead part is connected, and a second pad on the circuit board to which the external terminal of the other lead part is connected, wherein a higher voltage is applied to the first pad than to the second pad.

* * * * *